(12) United States Patent
Uzoh et al.

(10) Patent No.: US 7,147,766 B2
(45) Date of Patent: *Dec. 12, 2006

(54) CHIP INTERCONNECT AND PACKAGING DEPOSITION METHODS AND STRUCTURES

(75) Inventors: Cyprian Emeka Uzoh, Milpitas, CA (US); Homayoun Talieh, San Jose, CA (US); Bulent Basol, Manhatan Beach, CA (US)

(73) Assignee: ASM NuTool, Inc., Fremont, CA (US)

( * ) Notice: Subject to any disclaimer, the term of this patent is extended or adjusted under 35 U.S.C. 154(b) by 494 days.

This patent is subject to a terminal disclaimer.

(21) Appl. No.: 10/407,892

(22) Filed: Apr. 4, 2003

(65) Prior Publication Data

US 2003/0164302 A1    Sep. 4, 2003

Related U.S. Application Data

(60) Continuation of application No. 09/905,335, filed on Jul. 13, 2001, now Pat. No. 6,905,588, which is a division of application No. 09/398,258, filed on Sep. 17, 1999, now Pat. No. 6,355,153.

(51) Int. Cl.
C25D 5/02 (2006.01)
C25D 5/48 (2006.01)
C25D 5/52 (2006.01)

(52) U.S. Cl. .................. 205/118; 205/123; 205/221; 205/222

(58) Field of Classification Search ............... 205/118, 205/123, 221, 222
See application file for complete search history.

(56) References Cited

U.S. PATENT DOCUMENTS 3,959,089 A     5/1976  Watts
4,610,772 A     9/1986  Palnik
5,024,735 A     6/1991  Kadija
5,055,425 A    10/1991  Cobarruviaz et al.
5,151,168 A     9/1992  Gilton et al.
5,174,886 A    12/1992  King et al.
5,316,974 A *   5/1994  Crank ..................... 438/643
5,436,504 A     7/1995  Chakravorty et al.
5,575,206 A    11/1996  Szyszko
5,723,387 A     3/1998  Chen
5,911,619 A     6/1999  Uzoh et al.
5,930,669 A     7/1999  Uzoh
6,004,880 A    12/1999  Liu et al.
6,140,234 A *  10/2000  Uzoh et al. ............. 438/678
6,162,728 A *  12/2000  Tsao et al. .............. 438/687

(Continued)

FOREIGN PATENT DOCUMENTS

DE           2008664         9/1971

(Continued)

*Primary Examiner*—Edna Wong
(74) *Attorney, Agent, or Firm*—Knobbe, Martens, Olson & Bear, LLP

(57) ABSTRACT

The present invention relates to a method for fabricating high performance chip interconnects and packages by providing methods for depositing a conductive material in cavities of a substrate in a more efficient and time saving manner. This is accomplished by selectively removing portions of a seed layer from a top surface of a substrate and then depositing a conductive material in the cavities of the substrate, where portions of the seed layer remains in the cavities. Another method includes forming an oxide layer on the top surface of the substrate such that the conductive material can be deposited in the cavities without the material being formed on the top surface of the substrate. The present invention also discloses methods for forming multi-level interconnects and the corresponding structures.

30 Claims, 15 Drawing Sheets

U.S. PATENT DOCUMENTS

| | | | |
|---|---|---|---|
| 6,176,992 B1 * | 1/2001 | Talieh | 205/87 |
| 6,287,968 B1 * | 9/2001 | Yu et al. | 438/675 |
| 6,297,140 B1 * | 10/2001 | Uzoh et al. | 438/612 |
| 6,300,250 B1 * | 10/2001 | Tsai | 438/694 |
| 6,355,153 B1 * | 3/2002 | Uzoh et al. | 205/87 |
| 6,368,484 B1 | 4/2002 | Volant et al. | |
| 6,905,588 B1 * | 6/2005 | Uzoh et al. | 205/87 |

FOREIGN PATENT DOCUMENTS

| | | |
|---|---|---|
| DE | 4324330 A1 | 2/1994 |
| EP | 751567 | 1/1997 |
| EP | 881673 | 12/1998 |
| EP | 930647 | 7/1999 |
| EP | 930647 A1 * | 7/1999 |
| EP | 933812 | 8/1999 |
| FR | 2276395 | 1/1976 |
| FR | 0 933 812 A1 | 12/1998 |

\* cited by examiner

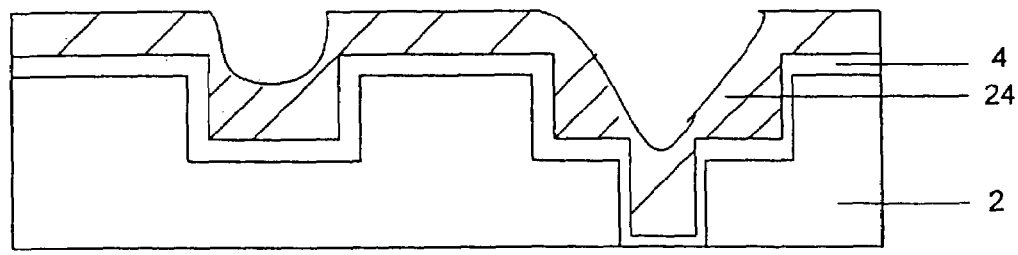
FIG. 3Biia
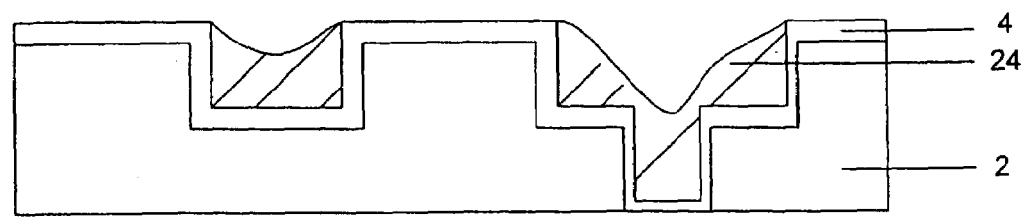
FIG. 3Biib
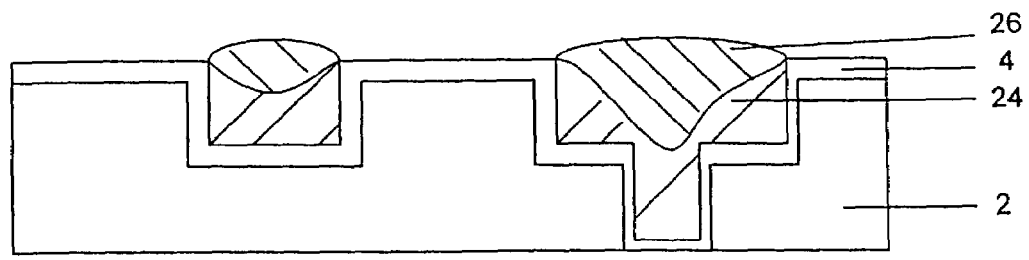
FIG. 3Biic
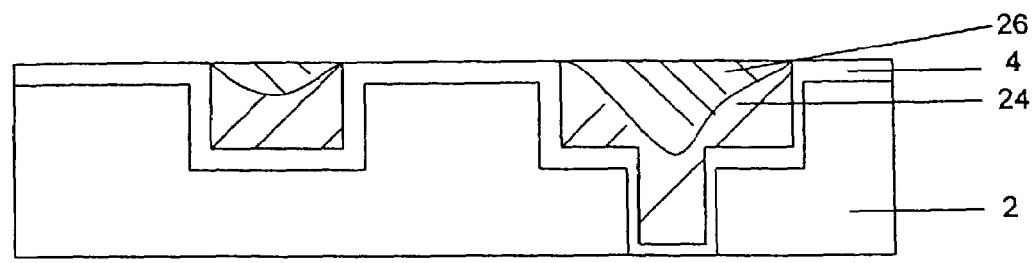
FIG. 3Biid

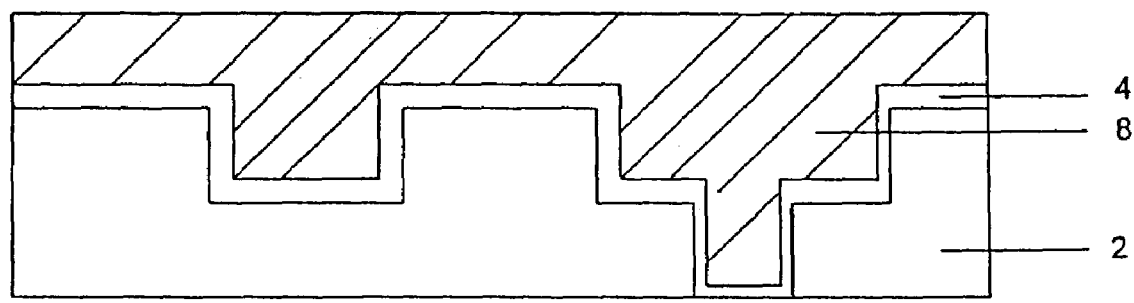
FIG. 3Biii

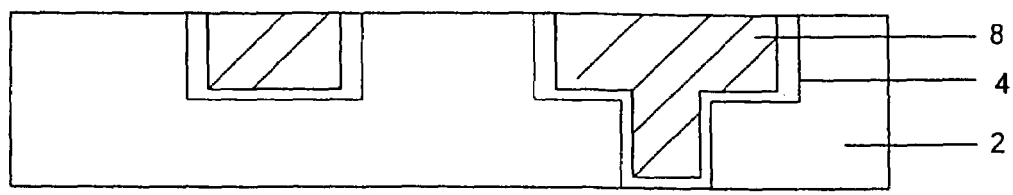
FIG. 3D
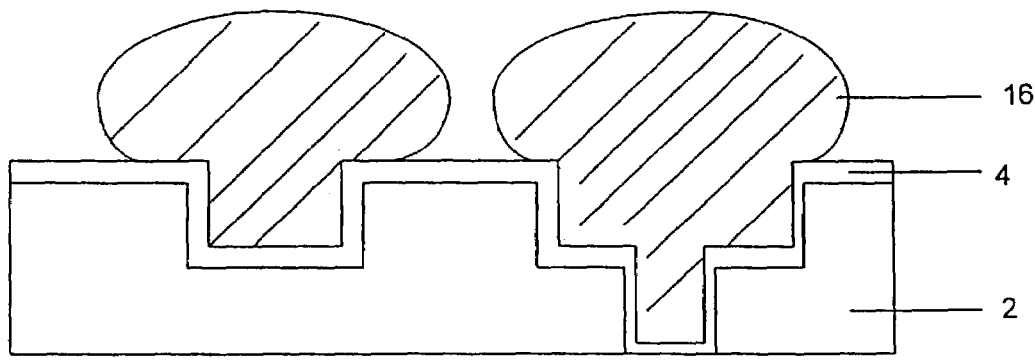
FIG. 3Ciia
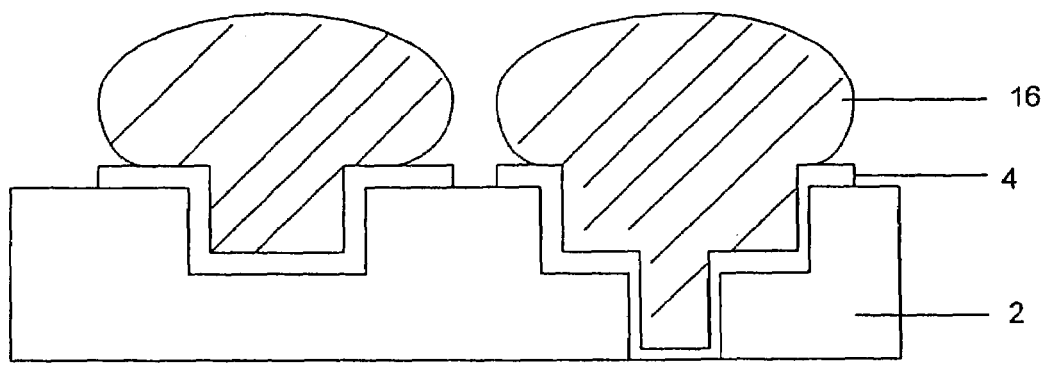
FIG. 3Ciib

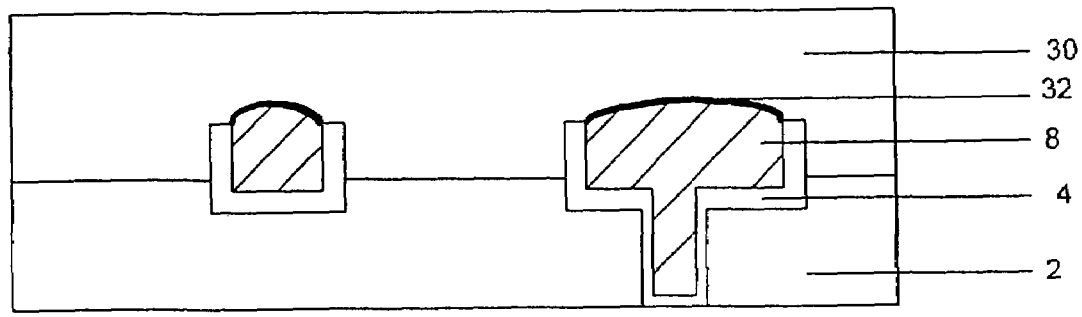
FIG. 4D
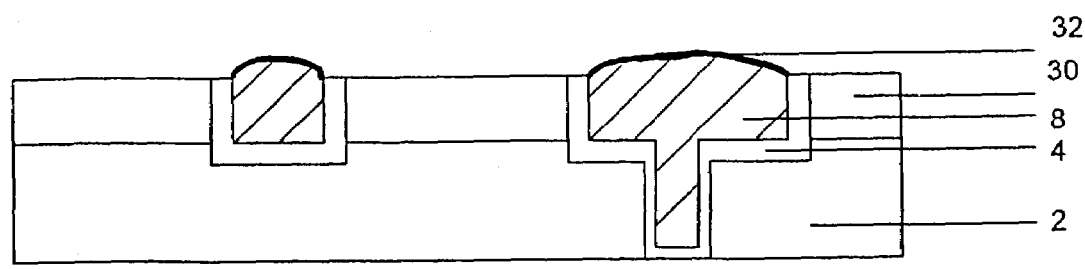
FIG. 4Ei
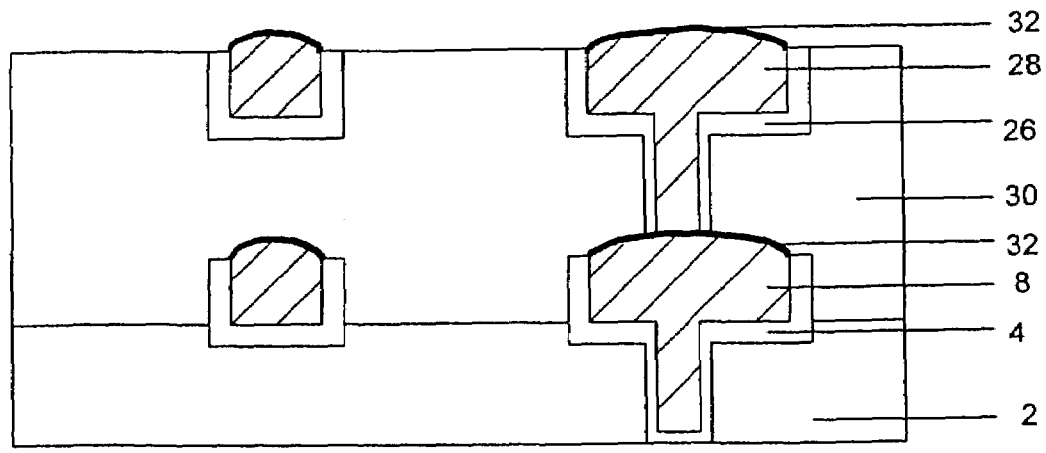
FIG. 4Eii

CHIP INTERCONNECT AND PACKAGING DEPOSITION METHODS AND STRUCTURES

REFERENCE TO RELATED APPLICATIONS

This application is a continuation of Ser. No. 09/905,335 filed Jul. 13, 2001(NT-013DIV) now U.S. Pat. No. 6,905,588, which is a divisional of Ser. No. 09/398,258 filed Sep. 17, 1999, now U.S. Pat. No. 6,355,153 (NT-013), all incorporated herein by reference.

FIELD OF THE INVENTION

The present invention relates to a method for fabricating high performance chip interconnects and packages. More particularly, the present invention is directed to a method for insitu-selectively removing portions of a seed layer from a top surface of a substrate while preventing removal of the seed layer from the cavities formed therein. Moreover, the present invention discloses methods for depositing a conductive material in cavities of a substrate.

BACKGROUND OF THE INVENTION

Depositing a metal/conductive material in cavities (trenches, holes, and vias) of a substrate or workpiece has important and broad application in the semiconductor and non-semiconductor industries. Conductive materials are deposited in cavities of the substrate to interconnect layers and components contained therein. In recent times, there is great interest in fabricating chips and devices with very high aspect ratio and sub micron level features (e.g., below 0.25 um). As a result, copper is the preferred conductive material of choice as it provides better conductivity and reliability than, for example, aluminum or aluminum alloys.

FIGS. 1A–1C illustrate one conventional method for depositing a conductive material in the cavities of a substrate (e.g., workpiece). FIG. 1A illustrates a cross sectional view of a substrate having various layers disposed thereon. This figure illustrates a silicon dioxide layer ($SiO_2$) 2 (dielectric layer) having deposited thereon a barrier or adhesive layer 4 and a seed layer 6.

The dielectric layer 2 is generally etched with cavities before the barrier layer 4 and the seed layer 6 are deposited thereon. The cavities in the dielectric layer 2 are generally etched using a reactive ion etching (RIE) method. The barrier layer 4 may be tantalum (Ta), titanium (Ti), tungsten (W), titanium-tungsten (TiW), titanium nitride (TiN), Nb, CuWP, CoWP, or other materials or combinations thereof that are commonly used in this field. The barrier layer 4 is generally deposited on the dielectric layer 2 using any of the various sputtering methods, chemical vapor deposition (CVD), electro-deposition or electrolyte/electroless plating method. Thereafter, the seed layer 6 is deposited over the barrier layer 4. The seed layer 6 may be deposited on the barrier layer 4 again using various sputtering methods, CVD, or electroless deposition or combinations thereof. The seed layer 6 thickness, depending on the substrate topography, may vary from 20 to 4000 Å.

After depositing the seed layer 6, a conductive material 8 (e.g., copper) is generally used to fill the cavities of the dielectric layer 2. This is illustrated in FIG. 1B. The conductive material 8 may be formed on the seed layer 6 by CVD, sputtering, electroless plating, electrodeposition, or combinations thereof. The conductive material 8 and the seed layer 6 are generally the same material. The cavities are typically overfilled with the conductive material 8 as shown.

Once the conductive material 8 is formed in the cavities of the substrate, the substrate is typically transferred to another equipment for polishing/planarizing the top surface of the substrate as illustrated in FIG. 1C. Typically, the substrate is planarized using a conventional chemical mechanical polishing (CMP) device. The conductive material 8 overburden can be removed using a conventional CMP method. Portions of the seed layer 6 and the barrier layer 4 on the top surface of the substrate are also polished to electrically isolate the various structures. The remaining seed layer 6 in the cavities is embodied in the conductive material 8 as illustrated in FIG. 1C.

Referring back to FIGS. 1A–1B, the depth 9c of the cavities in the dielectric layer 2 can range from 0.2 to 5 um for interconnects and up to 50 um or more for packages. When depositing the conductive material 8 over the substrate, it is desirable to overfill the cavities to, for example, 50 to 200% of the depth 9c in order to minimize defects in the wiring structure. For example, for the structure of FIG. 1A, assume that the depth 9a is about 0.5 um and the width 9b is about 10.0 um. Thus, the larger cavity includes the width 9b of 10.0 um and a total depth of about 1.0 um (measured from the bottom of the cavity to the top of the substrate). To completely fill the larger cavity, a minimum depth of at least 1.0 um of the conductive material 8 must be deposited therein. Further, an additional amount of the conductive material 8 is overfilled in the larger cavity to make certain that the cavity is completely filled and to minimize wiring defects. Thus, the additional amount (i.e., 50%) of the conductive material 8 over the larger cavity should be at a depth 9e of at least 0.5 um. In this case, when the depth 9e is about 0.5 um, the conductive material 8 formed over the field regions will be at a depth 9d of about 1.5 um. In other words, an overburden of at least 1.5 um of the conductive material 8 will be deposited over most of the field regions of the substrate while a smaller overburden of at least 0.5 um will be deposited over the larger cavities. Thus, the overburden of 0.5 to 1.5 um of the conductive material 8 will be deposited over the various features of the substrate.

The disparity of the conductive material 8 overburden across the substrate results in longer polishing time and higher costs using the conventional CMP process. Thus, there is a need for a deposition process that minimizes the amount of the conductive material 8 overburden across the substrate, as well as to minimize the disparity of the overburden depths on the surface of the substrate.

FIGS. 2A–2F illustrate another conventional method for depositing a conductive material in the cavities of a substrate. FIG. 2A illustrates a dielectric ($SiO_2$) layer 2 that is etched with cavities and having a barrier layer 4 and a seed layer 6 deposited thereon, similar to the structure of FIG. 1A. Again, the cavities in the dielectric layer 2 are typically etched using an RIE method.

FIG. 2B illustrates a photoresist material 12 coated on top of the seed layer 6. Using a positive photoresist process, a mask (not shown) is used such that ultraviolet light is applied only to the photoresist material 12 that is formed in the cavities of the substrate. The photoresist that is exposed to the ultraviolet light (photoresist in the cavities) is degraded as the ultraviolet light breaks down the molecular structure of the photoresist. The degraded photoresist is then removed from the cavities of the substrate using an appropriate solvent or RIE method, resulting in the structure as illustrated in FIG. 2C. Although a positive photoresist process is described herein, a negative photoresist process can also be used to form the structure of FIG. 2C.

For substrates having large cavities of, for example, width 9b greater than 2 um, photoresist removal from the cavities may require additional steps. For example, the photoresist material 12 in the cavities may interact with the seed layer 6 such that using a solvent to remove the photoresist material 12 may be inadequate. In this case, after applying the solvent for photoresist dissolution, the substrate is exposed to oxygen plasmas in order to ash away/strip off the remaining photoresist material 12 from the seed layer 6 in the cavities of the substrate.

When exposing a copper seed layer to oxygen plasma, copper oxides, copper sulfides, or copper-oxide-sulfide compounds may be formed on the copper seed layer, particularly when the photoresist material contains sulfur-bearing elements. These compounds that are formed on the copper seed layer is generally resistive to a conductive material, and should be removed before any conductive material is deposited on the seed layer. Thus, a second stripping process may be required to remove the oxides, sulfides, or oxide-sulfides.

In many wiring structures having submicron features, the copper seed layer in the cavities may be deposited to a thickness between 15 to 1000 Ao. In other cases, particularly when feature size is below 0.5 um and the aspect ratio is greater than 1.5, the copper seed layer in the cavities may be very thin or even discontinuous. In this case, applying the photoresist material on the discontinuous seed layer in the cavities may result in portions of the seed layer being consumed by the photoresist material, thereby resulting in a substrate having a large number of defects. In FIG. 2D, a conductive material 8 (e.g., copper) is deposited in the cavities from a suitable electroplating or electroless bath, while the remaining photoresist 12 prevents the conductive material 8 from being formed on the top surface of the substrate. After depositing the conductive material 8 in the cavities, the entire photoresist is removed using appropriate solvent or RIE, resulting in the structure of FIG. 2E. Thereafter, portions of the seed layer 6 and the barrier layer 4 on the top surface of the substrate are etched or polished using conventional methods (e.g., CMP, RIE, or combinations thereof), resulting in the structure illustrated in FIG. 2F.

Using an alternative conventional method, the photoresist material 12 and the seed layer 6 on the top surface of the substrate as shown in FIG. 2B may be removed using a CMP equipment and an abrasive slurry. Using this method, some abrasive particulates will be trapped in the cavities, where the abrasives become mechanically attached to the sidewalls of the cavities. When the abrasives are attached to the sidewalls of the cavities, they are often very difficult to remove, thereby resulting in substrates have various defects when the conductive material is deposited in the cavities.

The conventional methods described above for fabricating chip interconnects and packages require multiple steps and/or equipments. The time and effort needed during this phase of the fabrication process can be improved and simplified. Accordingly, there is a need for methods that can deposit a conductive material in the cavities of a substrate in a more efficient and effective manner. The present invention overcomes these and other disadvantages of prior art methods.

SUMMARY OF THE INVENTION

It is an object of the present invention to provide a method that removes the seed layer from a top surface of a substrate while preventing or minimizing removal of the seed layer from the cavities of the substrate.

It is another object of the present invention to provide a method that deposits a conductive material in the cavities of a substrate after selectively removing the seed layer from the top surface of the substrate.

It is a further object of the present invention to provide a method that removes a seed layer from a top surface of a substrate using a pad type material while preventing removal of the seed layer from the cavities of the substrate.

It is yet another object of the present invention to provide a method that removes the seed layer from a top surface of a substrate while depositing a conductive material in the cavities of the substrate.

It is another object of the present invention to provide a method that reduces and minimizes the conductive material overburden across a substrate while depositing the conductive material in the cavities of the substrate.

It is yet another object of the present invention to provide a method that minimizes the disparity of the conductive material overburden across a substrate while depositing the conductive material in the cavities of the substrate.

It is a further object of the present invention to provide a method for forming a multi-layered structure having cavities with capped conductive materials.

It is yet a further object of the present invention to provide a method for depositing a conductive material in cavities of the substrate after forming an oxide layer on the top surface of the substrate.

The present invention discloses methods for depositing a conductive material in cavities of a substrate in a more efficient and time saving manner. One method according to the present invention includes selectively removing portions of a seed layer from a top surface of a substrate and then depositing a conductive material in the cavities of the substrate, where portions of the seed layer remains in the cavities. A pad type material that is attached to an anode is used to polish the seed layer from the top surface of the substrate. Another method includes forming an oxide layer on the top surface of the substrate such that the conductive material can be deposited in the cavities without the material being formed on the top surface of the substrate. The present invention also discloses the structures that are formed using the methods described herein.

BRIEF DESCRIPTION OF THE DRAWINGS

These and other objects and advantages of the present invention will become apparent and more readily appreciated from the following detailed description of the presently preferred exemplary embodiments of the invention taken in conjunction with the accompanying drawings, of which:

FIGS. 3A–3D illustrate cross sectional views of methods for depositing a conductive material in the cavities of a substrate in accordance with the preferred embodiment of the present invention;

FIGS. 4A–4E illustrate cross sectional views of a method for forming a multi-layered structure having capped conductive materials in accordance with the preferred embodiment of the present invention;

DETAILED DESCRIPTION OF THE PREFERRED EMBODIMENTS

Figure 1A:
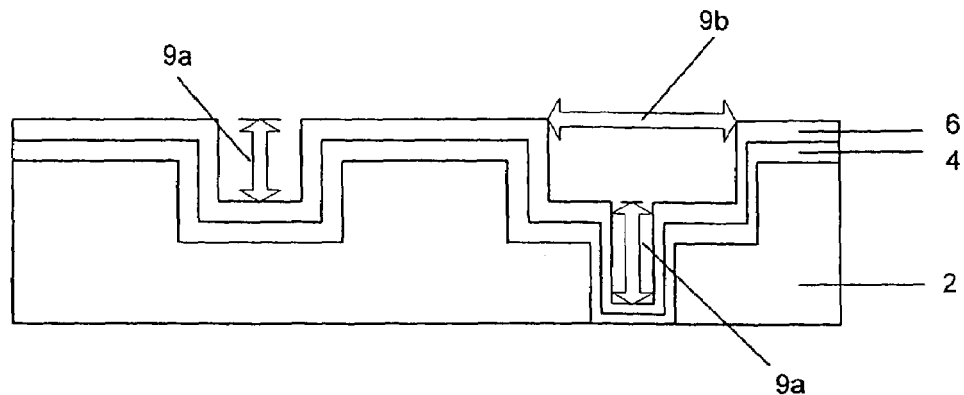
FIGS. 1A–1C illustrate cross sectional views of one conventional method for depositing a conductive material in the cavities of a substrate.

The preferred embodiments of the present invention will now be described with reference to FIGS. 3–8, wherein like structures and materials are designated by like reference numerals throughout the various figures. The inventors of the present invention disclose herein methods for depositing a conductive material, preferably copper, in cavities of a substrate. The present invention can be used with any substrate or workpiece such as a wafer, flat panel, magnetic film head, integrated circuit, device, chip, and packaging substrate including lead-tin solder alloys, or lead free solderable alloys. Further, specific processing parameters provided herein are intended to be explanatory rather than limiting.

FIGS. 3A–3D illustrate cross sectional views of methods for fabricating chip interconnects and packages in accordance with the present invention. In other words, FIGS. 3A–3D disclose methods for depositing a material, preferably a conductive material/solution such as copper, in the cavities of a substrate. In another embodiment, the conductive material can be deposited in the cavities while selectively removing the seed layer from the top surface of the substrate.

The methods shown in FIGS. 3A–3D include the step depositing a conductive material in the cavities of the substrate using an apparatus having a pad type material attached to an anode. Such apparatus is described in greater detail in the co-pending U.S. application Ser. No. 09/373,681, filed Aug. 13, 1999, entitled "Method and Apparatus for Depositing and Controlling the Texture of A Thin Film", now U.S. Pat. No. 6,409,904, commonly owned by the assignee of the present invention, the contents of which are expressly incorporated herein by reference.

Figure 2A:
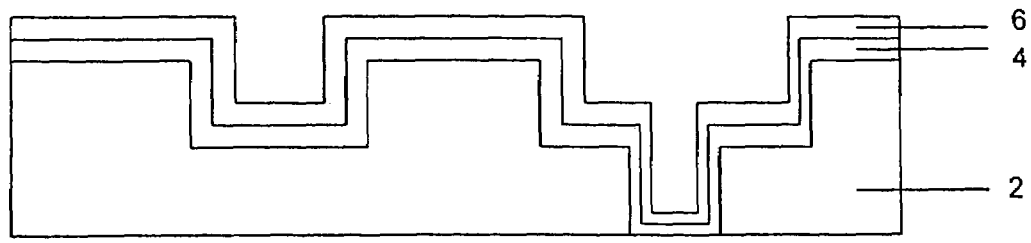
FIGS. 2A–2F illustrate cross sectional views of another conventional method for depositing a conductive material in the cavities of a substrate.
Figure 2B:
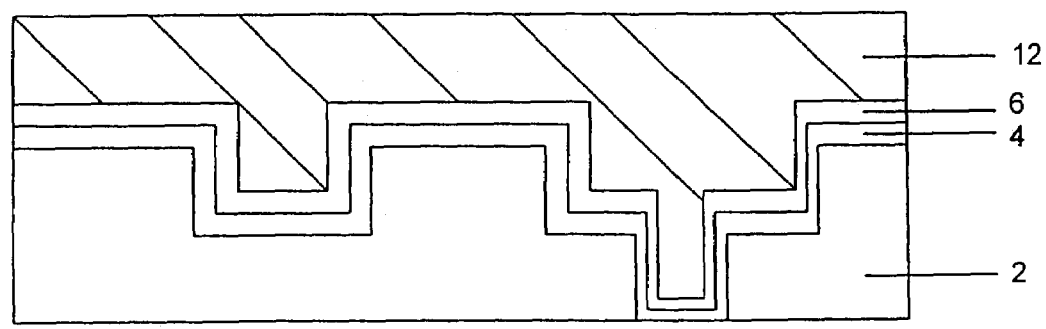
Figure 2C:
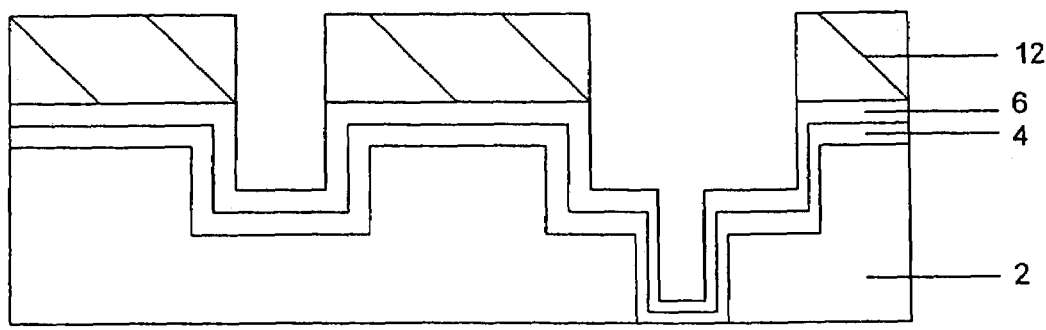
Figure 2D:
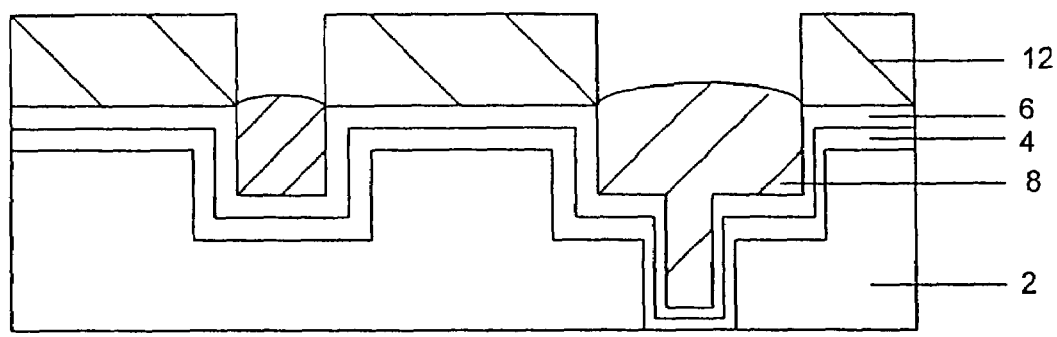
Figure 2E:
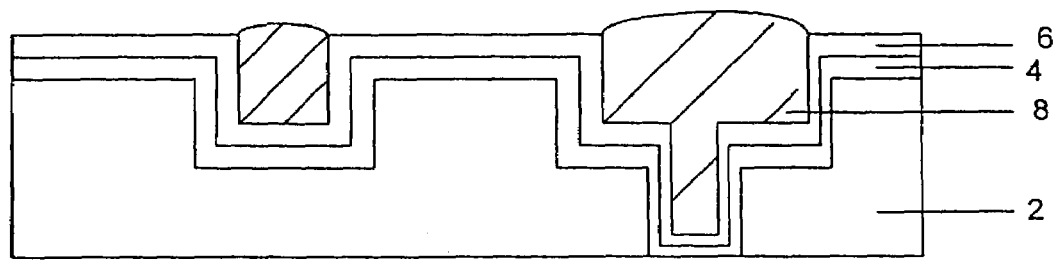
Figure 2F:
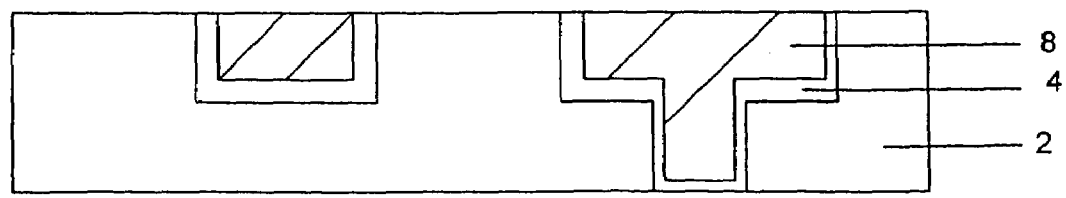
Figure 3A:
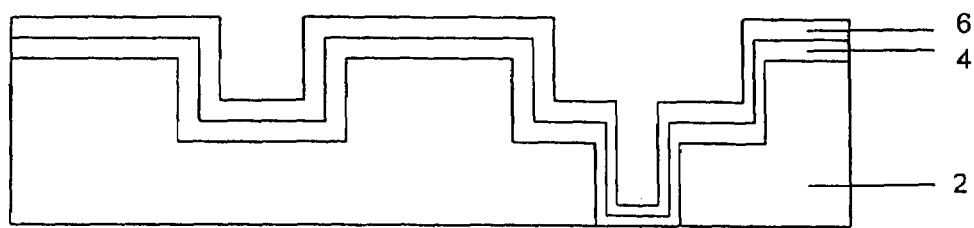

FIG. 3A illustrates a dielectric or $SiO_2$ layer 2 having deposited thereon a barrier or adhesive layer 4 and a seed layer 6, similar to that described above with reference to FIGS. 1A and 2A. Again, the top surface of the $SiO_2$ layer 2 is patterned/etched with cavities before the barrier layer 4 and seed layer 6 are deposited thereon. Although $SiO_2$ is presented herein as the dielectric layer 2, it is understood that other materials that are commonly used as the dielectric layer may be used in accordance with the present invention.

Figure 3B:
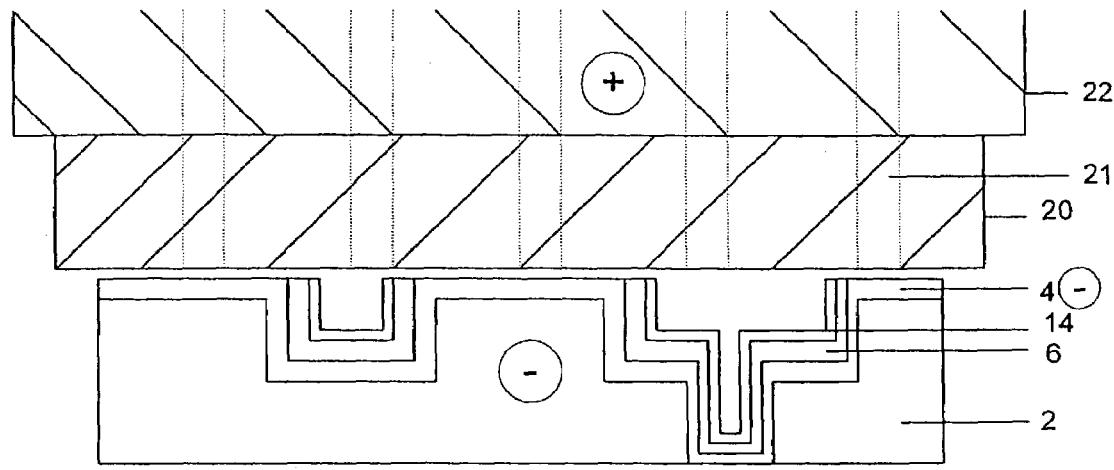

In FIG. 3Bi, a porous pad type material 20 with or without fixed abrasive particles (not shown) is used to selectively polish the seed layer 6 from the top surface (field regions) of the substrate. The pad type material 20 that is attached to an anode 22 may be rotated in a circular motion, vibrated, moved side to side or vertically and is brought into contact with the seed layer 6. The pad type material 20 and the anode 22 further include outlet channels 21 for channeling a conductive material/solution to the substrate. In the preferred embodiment, the anode 22, the pad type material 20, and the substrate may rotate between 50 to 2000 rpm, but preferably between 100 to 1200 rpm, during the selective removal of the seed layer 6. The seed layer 6 on the top surface of the substrate is polished when such operation occurs for 2 to 60 seconds, but preferably for about 5 to 25 seconds.

When such contact is made, the pad type material 20 polishes the seed layer 6 residing on the top surface of the substrate without removing the seed layer 6 in the cavities. During this removal step, the pad type material 20 makes contact with the seed layer 6 at a pressure that may range from 0.05 to 5 psi. Further, the conductive solution containing for example, copper, may emanate from the outlet channels 21 of the pad type material 20 and may be applied to the substrate at 0.01 to 5 gallons per minute (gpm), but preferably between 0.05 to 3 gpm. When an electric potential is applied between the anode 22 and the conducting substrate, a small amount of conductive film 14 may be deposited within the cavities of the substrate, while the pad type material 20 is selectively removing the seed layer 6 and the conductive solution from the top surface of the substrate. The purpose of applying the electrical potential between the anode 22 and the conducting substrate and generating an electric current is to avoid the dissolution of the seed layer 6 in the cavities during the process of polishing the top surface of the substrate. During this step, a substrate holder (not shown) that is capable of rotating in a circular motion, and moving side to side or vertically, guides the substrate in proper position/movement.

In an alternative embodiment, the conductive (protective or sacrificial) film 14 may be redissolved in an electrolyte solution to momentarily protect the original seed layer 6, while removing the conductive film from the field regions and before a copper conductive material is deposited in the cavities of the substrate. After removing the seed layer 6 from the field regions, the electrodes may be de-energized for a short period of time (i.e., 2–10 seconds) for the electrolyte solution to dissolve the protective or sacrificial film 14. Also, the substrate may be rendered anodic momentarily to improve the seed layer removal process from the field regions.

During the selective removal process of the seed layer 6 from the top surface of the substrate, an electrical current density between 0.05 to 15 $mA/cm^2$, but preferably between 0.1 to 10 $mA/cm^2$, (depending on the nature of the bath chemistry) is applied to the substrate. This electric current density range prevents seed layer 6 dissolution in the cavities and may allow a small amount of the conductive film 14 to be deposited thereon, as described above. It is important to note that during this process, the seed layer 6 on the top surface of the substrate is removed while the seed layer 6 within the cavities remains. The seed layer 6 remaining in the cavities of the substrate allows for a more efficient and effective deposition of a conductive material because it has a lower resistance than the barrier layer 4 to the conductive material.

Figure 3C:
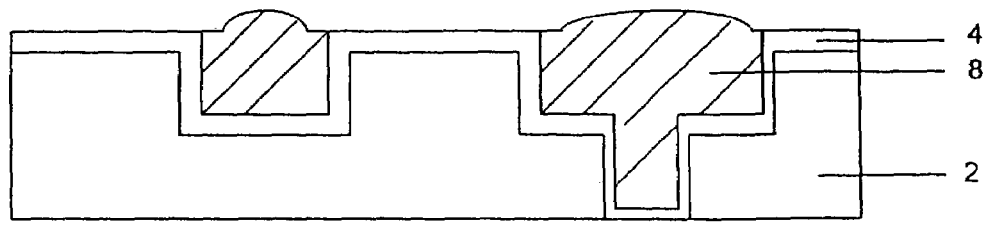

After removing the seed layer 6 from the top surface of the substrate, the deposition current density may be increased to fill the cavities with the conductive material 8, resulting in the structure as shown in FIG. 3Ci. The conductive material 8 can be deposited in the cavities of the substrate since the remaining seed layer 6 in the cavities provides less resistance than the barrier layer 4 on top of the substrate. As a result, the conductive material 8 is more efficiently deposited on the seed layer 6 in the cavities than on the barrier layer 4 on the top surface of the substrate. In other words, the conductive material 8 will tend to form in the cavities of the substrate rather than on the barrier layer 4 on the top surface of the substrate. The conductive film 14 and the remaining seed layer 6 in the cavities are embodied in the conductive material 8.

The conductive material 8 can be deposited in the cavities using the anode 22 and the pad type material 20 via outlet channels 21. After polishing the seed layer 6 from the top surface of the substrate, the pad type material 20 can be positioned such that it is spaced apart from the top surface of the substrate between 1 micron to 2 millimeters. Electric current density can be increased to the anode 22 and the substrate between 5 to 250 mA/cm$^2$, but preferably between 7 to 150 mA/cm$^2$, in order to deposit the conductive material 8 in the cavities. Increasing the current density allows the conductive material 8 to fill the cavities of the substrate in a timely manner. The conducting barrier layer 4 is used to conduct the deposition current. Alternatively, the conductive material 8 can be deposited in the cavities while the pad type material 20 is actually making contact with the top surface of the substrate.

In an alternate embodiment, after selectively removing the seed layer 4, instead of electrodeposition, as described above, the cavities may be filled by electroless plating or selective metal CVD. In this case, the substrate is transferred to an electroless plating cell, and the conductive material is deposited accordingly.

Referring back to FIG. 3Ci, after depositing the conductive material 8 in the cavities, the barrier layer 4 can be removed by conventional polishing or RIE. After selectively removing the barrier layer 4 and planarizing/polishing the top surface of the substrate, the structure as illustrated in FIG. 3D is formed.

In an alternative embodiment, instead of depositing the conductive material as shown in FIG. 3Ci, the deposition time for depositing the conductive material may be increased, resulting in the structure as illustrated in FIG. 3Ciia. FIG. 3Ciia illustrates a packaging structure having a conductive material 16 deposited in the cavities. In packaging applications, lead-tin solder alloy or other solderable alloys 16 may be selectively deposited into the cavities using electrodeposition, evaporation, or other known methods. After the deposition step, portions of the barrier layer 4 are removed by RIE, using the conductive material 16 as a mask, to form the structure in FIG. 3Ciib.

In yet another embodiment of the present invention, different layers of conductive materials can be deposited in the cavities of the substrate after forming the structure illustrated in FIG. 3A.

For example, FIGS. 3Biia–3Biid illustrate a method for depositing one or more conductive materials in the cavities of a substrate. In FIG. 3Biia, using the anode 22 and the pad type material 20 (see FIG. 3Bi), a first conductive material 24 is deposited over the substrate for a period of, for example, 15–60 seconds at a current density of 5–35 mA/cm$^2$ using a highly leveling electroplating solution to partially fill in the cavities. Alternatively, the cavities can be partially filled using electroless or CVD methods.

The first conductive material 24 is generally filled to a level of 10 to 60% of the depth of the widest cavity on the substrate. The seed layer 6 is embodied in the first conductive material 24. After the first conductive material 24 is deposited over the substrate, the top surface of the substrate may be planarized/polished, resulting in the structure of FIG. 3Biib. The top surface of the substrate can be planarized using the pad type material 20.

Alternatively, the substrate can be transferred to a CMP cell for polishing the top surface of the substrate. A CMP pad having fixed abrasive particles and a polishing solution applied thereto is used to polish/rub against the substrate for a period of 3–60 seconds, but preferably between 5–30 seconds. It is important to note that the barrier layer 4 remains on the substrate and is not polished during this process.

After polishing the first conductive material 24 overburden, a second conductive material 26 is deposited in the cavities over the first conductive material 24, as illustrated in FIG. 3Biic. Second conductive material 26 deposition may be performed using the anode 22 and the pad type material 20 or alternatively, in another deposition cell using electroless or CVD methods. For example, the first conductive material 24 may be deposited on the substrate using electro-deposition, while the second conductive material 26 may be deposited by electroless or CVD methods. After depositing the second conductive material 26 on the first conductive material 24, the second conductive material 26 can be planarized/polished using CMP or RIE to form the structure as illustrated in FIG. 3Biid.

The process described above with reference to FIGS. 3Biia–3Biid illustrate one combination of steps that may be performed to filled the cavities with various conductive materials. In another embodiment, the following chronological steps may be performed: (1) depositing a first conductive material partially in the cavities and the field regions; (2) polishing the first conductive material from the field regions; (3) annealing the substrate; (4) selectively depositing a second conductive material in the cavities; and (5) polishing/planarizing the substrate. Alternatively, the conductive materials can be deposited using the following sequence of steps: (1) depositing a first conductive material partially in the cavities and the field regions; (2) annealing the substrate; (3) polishing the first conductive material from the field regions; (4) selectively depositing a second conductive material in the cavities; and (5) polishing/planarizing the substrate. Other combination of the above steps may be implemented in the present invention.

In more detail, the first and second conductive materials 24, 26, may be the same or different material. For example, the first conductive material 24 may be Cu and the second conductive material 26 may be Cu—Sn, Cu—In, or other suitable copper alloys. Preferably, the second conductive material 26 should be a material that will enhance corrosion resistance and electromigration, while providing excellent adhesion to the first conductive material 24 and to other subsequently deposited materials that may be formed thereon. Further, the second conductive material 26 may have an electrical resistivity that is very similar to the first conductive material 24, preferably within 90–200% of that of the first conductive material 24.

When the first and second conductive materials 24, 26 are the same material, a distinct boundary between them may not exist. On the other hand, when the first and second conductive materials 24, 26 are different, a distinct boundary between them may exist before any subsequent thermal process is performed. The distinct boundary layer can be used so that intermixing between the first and second conductive materials 24, 26 is discouraged. For example, a thin adhesive or barrier layer (e.g., alpha Tantalum, chrome layer, CoP, WCoP) may be deposited in between the first and second conductive materials 24, 26 to prevent intermixing between the two materials when such intermixing is undesired. In other embodiments, more than two conductive materials can be formed in the cavities of the substrate using the process disclosed herein.

Referring back to the various methods described in FIGS. 3A–3D, the inventors of the present invention now disclose a novel conductive solution (i.e., conductive material 8, 16, 24, 26) that is suitable for electro-depositing a copper material in the cavities while polishing the copper material from the top surface of the substrate. Using this solution, a conductive material such as copper can be deposited in the cavities of the substrate, while the same material is polished from the field regions of the substrate. The conductive solution, which may be acidic or alkaline, includes at least the following elements/compounds/sources: (1) source for metal ions; (2) source of current carriers; (3) source for chloride ions; (4) source for highly leveling bath additives; (5) metal oxidizing agents; (6) passivating agents; and (7) surfactants.

First, the conductive solution of the present invention contains a concentration of metal ions (i.e., Cu) from, for example, a sulfate, nitrate, or a pyrophosphate source. The metal ion concentration should range from ½ to 40 g/L, but preferably between 2 to 25 g/L.

Second, the conductive solution includes a source of current carriers besides the copper ions, which may include organic/inorganic acids and compounds such as sulfuric acid, phosphoric acid, acetic acid, butylacetic acid, propronic acid, butyric acid, ammonium sulfate, potassium hydroxide, tetra methyl, ammonium hydroxide, and the like. The acid concentration should range from 0.05 to 18% by volume, but most preferably, between 0.2 to 15% by volume.

For acidic baths, a third source of chloride ions, either organic or inorganic, is also included in the conductive solution of the present invention. The chloride ion concentration should range from 2–180 ppm, but preferably 10–170 ppm. For alkaline baths, ammonium may be used, about 0.5 to 3 ml/L.

The fourth element in the conductive material is a source of a highly leveling bath additives and various combinations thereof. These additives include commercial additives such as Cubath MD, Cubath ML and Cubath SC replenisher from Enthone-OMI, and/or Ultra fill additive A2001 and S2001 from Shipley. Other additives such as copper wafer additives 200B and 2000C from Technic, Inc., various mercapto compounds such as 2-mercapto ethanesulfonic acid or salt, 2-mercapto benzothiazole, 2-0mercapto-5-benzimidazole sulfonic acid or salt, 2-mercapto benzimidazole, mercapto benzotriazole, tartaric acid or salt may also be used. The additive concentration should range from 0.01 to 4% by volume, but preferably between 0.05 to 3% by volume. For alkaline baths, Kupralume 501 and 502 additives manufactured from Alchem Corporation may be used.

The fifth element/compound of the conductive material includes a metal oxidizing agent such as organic and inorganic oxidizing agents. These agents may include inorganic and organic peroxides, persulfates, nitrates, nitrites, thiosulfates, salts of nitrobenzene sulfonates, and the like. What is important from this example is that any component of the oxidizing agent should not adversely affect the deposited material. Organic peroxides such as butopronoxyl, tert-butyl hydroperoxide, tert-butyl peroxide, butyl nitrite, etc. may also be used. The peroxides (i.e. hydrogen peroxide) may be stabilized using small amounts of phenol sulfonates or primary diols (i.e., 1,4 butanediol). The concentration of the oxidizing agent may range from 0.1 to 60 g/L, but preferably between 0.2 to 40 g/L. Other suitable oxidants may be used for the redox reactions.

The sixth element/compound of the conductive material is an agent that passivates or enhances the passivation of copper or other metal materials. These agents may include benzotriazole, or combinations of benzotriazole with organic triazoles, such as benzotriazole-1-acetonitride, benzotriazole-5-carboxylic acid, 0-benzotriazole-1-yl-N,N',N'-bis (tetramethylene) uronium hexafluoro phosphate and combinations thereof. The concentration of the passivating agents should range from 0.0005 M to 0.1 M, but preferably between 0.001 M to 0.2 M. Also, the highly leveling additives and the corresponding inhibitors describe above may be used as passivating agents. What is important from this example is that the concentration of the passivating agent is adequate for the CMP process and is also below the threshold level that allows for conductive material deposition. Above this threshold level, hydrogen can be deposited at the cathode instead of the conductive material.

Besides the passivating agent, surfactants such as Duponol (Dupont Chem.) may be used, where the concentration of surfactant may range from 20 to 800 ppm, but most preferably between 40 to 600 ppm. In addition, pentose sugar such as xylose, arabinose, etc., may be added for oxygen scavenging in the deposited conductive material at a concentration of 0.05 to 10 grams per liter. Water can also be used to balance the conductive solution described herein.

Figure 1B:
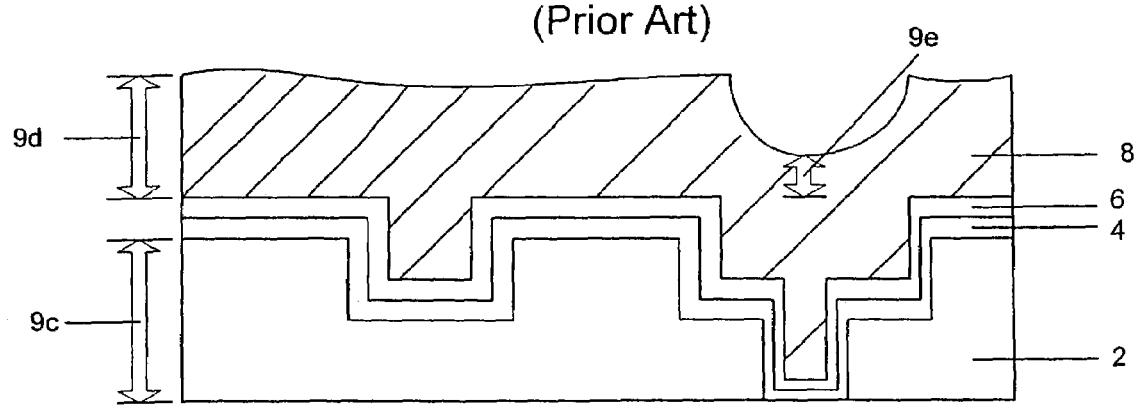
Figure 1C:
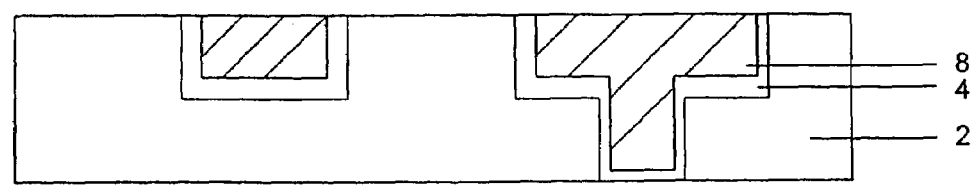

Such a conductive solution disclosed above allows for the simultaneous metal deposition within the cavities of a substrate while a pad type material removes all or most of the metal deposited over the field regions of the substrate. Such a formulation used in a plate and polish apparatus eliminates or minimizes the large amount of metal overburden as described in FIG. 1B.

In other applications, a uniform overburden of the conductive material may be desirable by controlling the deposition and polishing rates on the structure shown in FIG. 3A. For example, using a pad type material (i.e., pad 20 of FIG. 3Bi) and a plating and polishing electrolyte formulation, the conductive material 8 deposition and removal rates may be 10 mA/cm$^2$. Thus, the conductive material 8 begins to fill the cavities of the substrate while the same material is being polished from the field regions. When the cavities are filled with the conductive material 8, the deposition rate is increased slightly higher than the polishing rate such that a uniform overburden of the conductive material can be deposited on the substrate. The deposition and polishing rates can be adjusted by changing the current density, rate of rotation, period of rotation, etc. For example, for depositing the uniform conductive material overburden, the current density can range from 5 to 30 mA/cm$^2$ for a period of 10 to 90 seconds.

By depositing at a current density slightly higher than 10 mA/cm.sup0.2 (i.e., 10.5 mA/cm), a thin continuous uniform overburden is formed over the entire top surface of the substrate. The depth of the overburden may range from 0.1–10000 Å, or even higher, depending on the desired structure. Thus, by varying the deposition rate and/or the polish rate, any uniform conductive material 8 overburden may be obtained as shown in FIG. 3Biii.

As can be appreciated, the methods disclosed herein reduce the number of steps and simplifies the process of fabricating chip interconnects and packages. Portions of the seed layer are selectively removed from the top surface of the substrate while other portions of the seed layer remain in the cavities. One or more conductive materials can then be deposited in the cavities where the seed layer remains.

As described above, the preferred method according to the present invention is to selectively remove the seed layer and deposit the conductive material in the cavities in one chamber/cell. However, another method is to use a CMP apparatus and cell to first remove the seed layer and then to transfer the substrate to another different cell for deposition.

In another embodiment, the seed layer can be selectively removed from the top surface of the substrate using electroless plating. The electroless solution can emanate within the channels in the pad type material that is close proximity to an anode and the top surface of the substrate. The cavities are selectively filled with the conductive material while the seed layer is being removed from the top surface of the substrate by the pad type material having abrasive particles.

One of the overriding condition in these processes is that the removal rate of the seed layer is about 2 to 100 times faster than the deposition rate of the conductive material in the cavities. Thus, in the case of electroless and electrodeposition, after the seed layer removal from the top surface of the substrate, the substrate may be moved away from the pad type material, where the deposition process is performed, or alternatively, deposition is performed while maintaining physical contact between the top surface of the substrate and the pad type material.

In other embodiments, the removal rate of the seed layer from the top surface of the substrate may be the same as the deposition rate of the conductive material in the cavities of the substrate. In this case, the seed layer on the top surface is removed while simultaneously depositing the conductive material in the cavities.

In yet another embodiment, an initial alloy layer may be deposited in the cavities of the substrate while selectively removing the seed layer from the top surface of the substrate. For example, during the initial stage of selectively removing the seed layer from the top surface of the substrate (FIG. 3Bi), an electrolyte solution such as an alloy material may be deposited on the seed layer in the cavities to form an initial thin alloy layer. In the case where the conductive material is copper, the thin alloy film containing indium, cadmium, tin, and the like can be used.

After selectively removing the seed layer and depositing the thin alloy layer (reference number 14 of FIG. 3Bi) in the cavities, the substrate and/or the anode are de-energized so that the substrate may be spray rinsed. After rinsing the substrate, the cavities in the substrate may be selectively filled with copper using a suitable source such as an electroless or electroplating bath.

For optimum interconnect performance, it is highly desirable to stabilize the structure by annealing the deposited copper. Annealing may be allowed to occur at room temperature for over a period of three days or longer, or may be annealed in a suitable oven or tube furnace for faster annealing of 15 seconds to 2 hours. The annealing temperature may range from 60° to 450° C. in an inert ambient such as nitrogen or in a reducing ambient, or even in a vacuum chamber.

The thin alloy layer in the cavities is used to enhance the mechanical, corrosion, and electro-migration properties of the chip interconnect. The alloy layer is intermixed with the deposited conductive material in the cavities, where upon annealing the substrate, the alloy material enhances the structural properties of the chip interconnect.

Figure 4A:
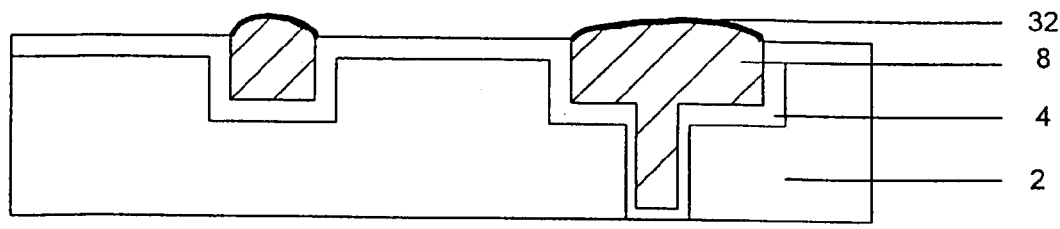

FIGS. 4A–4E illustrate cross sectional views of a method for forming a multi-layered structure having capped conductive materials in accordance with the preferred embodiment of the present invention. The filled cavities as shown in FIG. 3Ci may be selectively capped using a suitable barrier material. For example, a capping layer 32 such as CoP, NiP, WCoP, or combinations thereof can be formed on the copper material 8 using known methods, resulting in the structure as illustrated in FIG. 4A. The capping layer 32 prevents conductive material oxidation, acts as a barrier layer, and enhances adhesion.

Figure 4B:
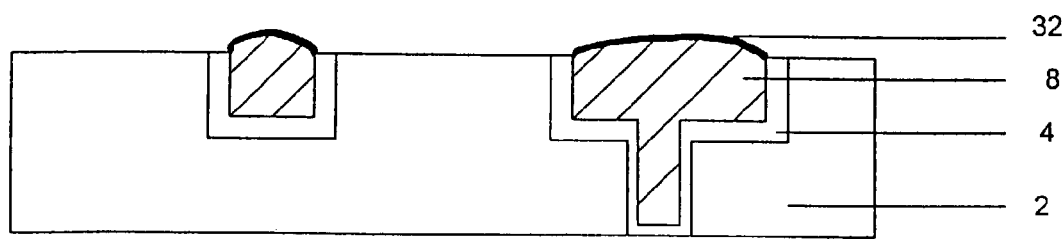

After forming the capping layer 32 on top of the conductive material 8, the barrier layer 4 formed on the top surface of the substrate may be selectively removed by RIE, as illustrated in FIG. 4B. After removing the barrier layer 4 from the top surface of the substrate, portions of the first dielectric material 2 may also be removed using RIE, resulting in the structure of FIG. 4C. For example, in the case where the first dielectric material is $SiO_2$, the depth of the cavities may range from 0.3 to 2.5 um. The amount of the first dielectric material 2 removed may range from 10 to 120% of the cavity depth, but most preferably, between 30 to 95%. Enough dielectric material 2 remains in order to support the nearly free-standing cavities.

Figure 4C:
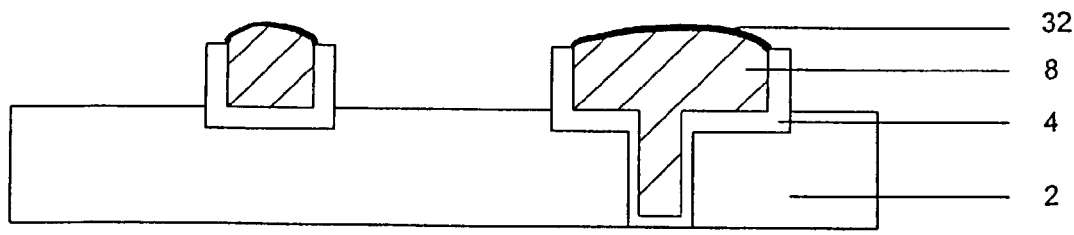

Next, a second dielectric material 30 may be deposited by CVD or spin-on process over the substrate of FIG. 4C to form the structure of FIG. 4D. The second dielectric material 30 is then planarized/etched to expose the capped layer 32, as shown in FIG. 4Ei. The second dielectric material 30 may be a low or high dielectric material.

In another embodiment of the present invention, the second dielectric material 30 as shown in FIG. 4D may be patterned by lithographic methods. The dielectric material 30 can then be etched using RIE to form additional cavities. After barrier and seed layer depositions on the second dielectric material 30, the seed layer is again selectively removed from the top surface of the second dielectric material 30 and a second conductive material 28 is deposited in the cavities of the second dielectric layer 30, resulting in a structure of FIG. 4Eii.

Figure 5A:
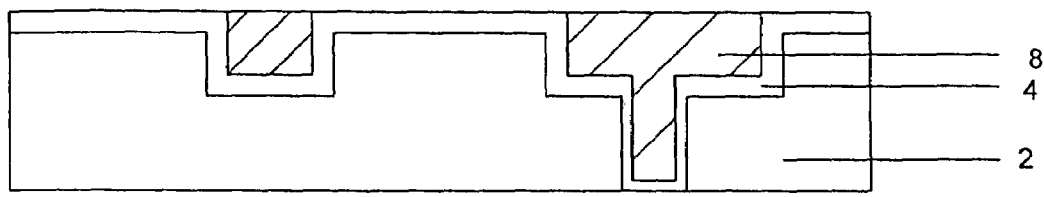
FIGS. 5A–5F illustrate cross sectional views of another method for forming a multi-layered structure having capped conductive materials in accordance with the preferred embodiment of the present invention.

FIGS. 5A–5F illustrate cross sectional views of another method for forming a multi-layered structure in accordance with the preferred embodiment of the present invention. A through-mask deposition method either by CVD, electroless or electrodeposition may be used to deposit a second conductive material on the first conductive material. FIG. 5A illustrates the structure of FIG. 3D.

Figure 5B:
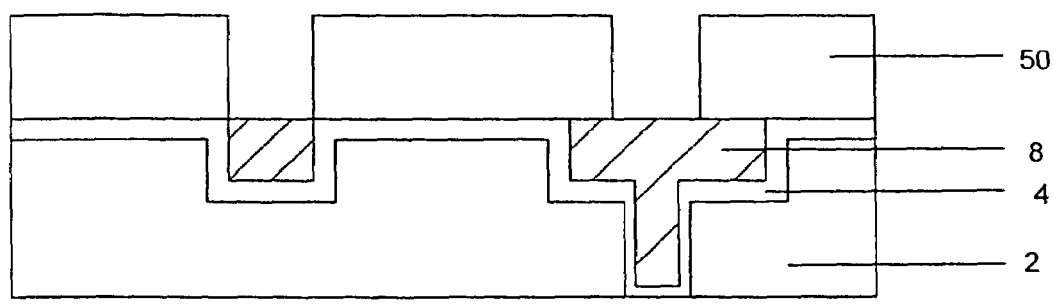
Figure 5C:
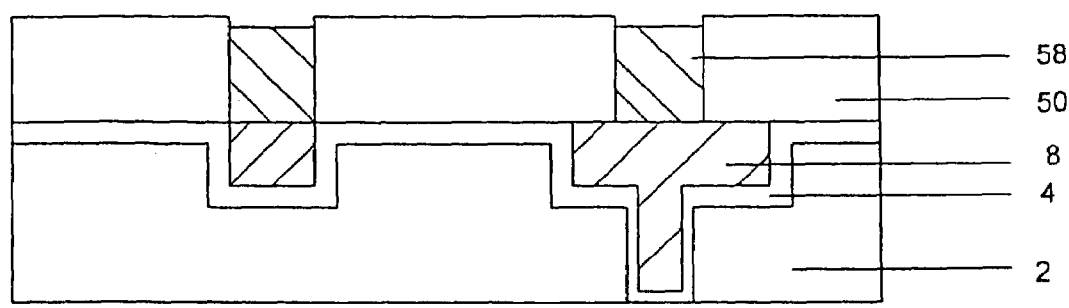
Figure 5D:
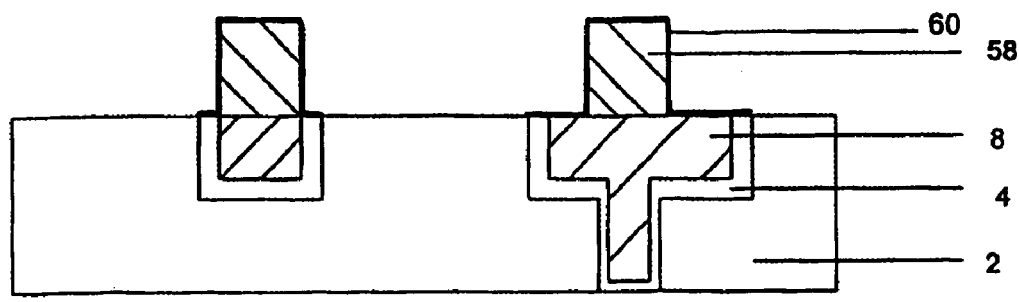

FIG. 5B illustrates a photoresist material 50 that has been coated on the substrate, where portions of the photoresist 50 have been removed such that a second conductive material may be deposited on the first conductive material 8. The second conductive material 58 is deposited in those portions where the photoresist 50 have been removed as shown in FIG. 5C. The first and second conductive layers may be the same or different materials. The photoresist 50 and portions of the barrier layer 4 are removed using conventional methods, resulting in the structure of FIG. 5D. The second conductive material 58 remains free standing.

Figure 5E:
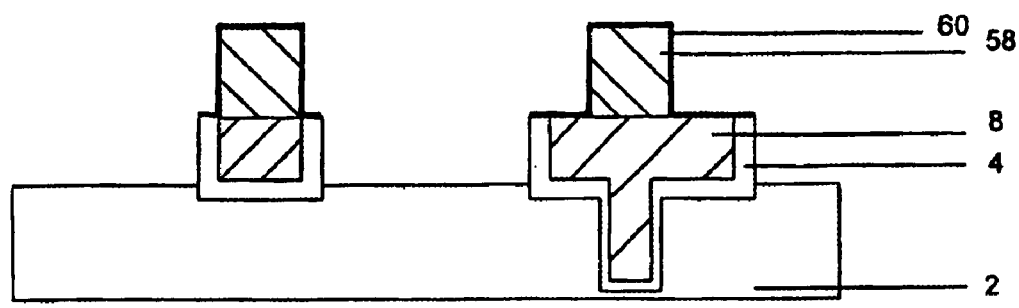
Figure 5F:
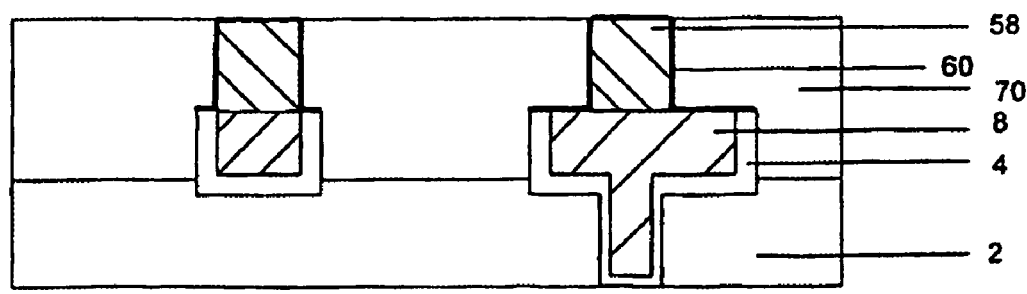

The second conductive material 58 is then selectively capped by electroless deposition methods before removing portions of the barrier layer 4 and the first dielectric layer 2. In this case, portions of the barrier layer 4 may be removed together with portions of the dielectric layer 2 as described earlier herein to form the structure as illustrated in FIG. 5E. The capped layer 60 coats the new structure of FIG. 5E with either a low or high dielectric material. Next, a second dielectric layer 70 may be formed and planarized to form the structure of FIG. 5F.

Figure 6A:
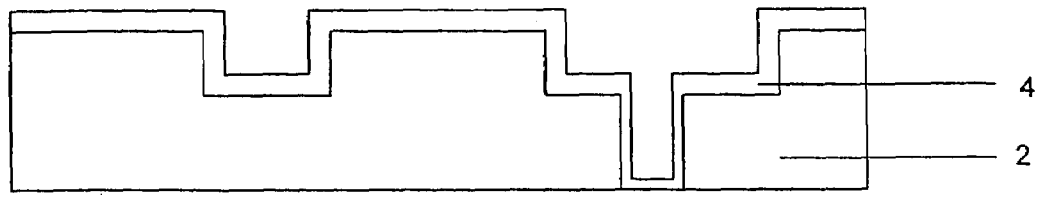
FIGS. 6A–6C illustrate cross sectional views of another method for depositing a conductive material in the cavities of a substrate in accordance with the preferred embodiment of the present invention.
Figure 6B:
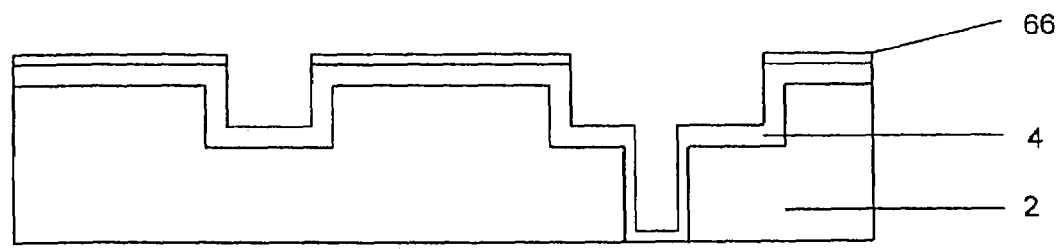
Figure 6C:
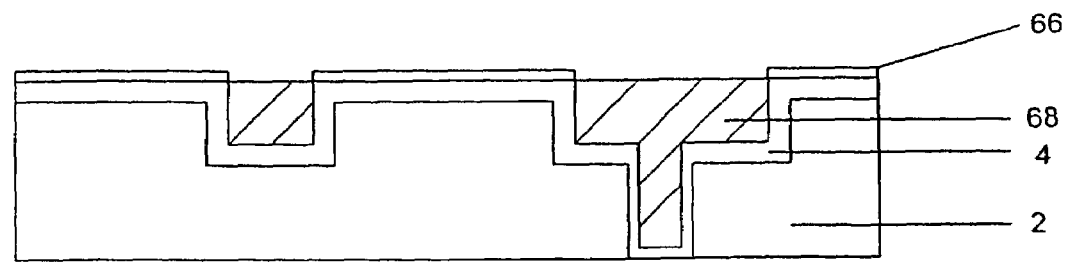

FIGS. 6A–6C illustrate another method for depositing a conductive material in the cavities of the substrate without depositing the same material on the top surface of the substrate. This is accomplished by insulating only the top surface of the substrate. For example, FIG. 6A illustrates a structure showing a SiO.sub0.2 layer 2 having deposited thereon a barrier layer 4. The barrier layer 4 can be one of the well known materials such as Ta, W, or TaN as described earlier herein. These materials are known to form surface oxide layers that are uniform, which may be formed electrolytically by anodization.

Using the anodization technique, the material of interest is dipped into an electrolyte solution and a positive voltage is applied thereto with respect to a cathode, which is also in contact with the electrolyte solution. A surface oxide forms on the anodized material and the thickness of the surface oxide is dependent on the nature of the electrolyte solution and the applied voltage. Generally, higher anodization voltages lead to thicker surface oxide films. In FIG. 6B, after anodization, a thin oxide layer 66 is formed on the barrier layer 4 only on the top surface of the substrate. Once the thin oxide layer 66 is formed, a conductive material such as copper can be used to fill the cavities by electroplating without the conductive material forming on the oxide layer 66, thereby forming the structure as illustrated in FIG. 6C. The structure of FIG. 6C is formed because the oxide layer 66 has a very high resistance to the conductive material, and thus the conductive material is formed in the cavities of the substrate.

Referring back to FIG. 6B, the anodization should be performed such that there remains some appreciable barrier layer 4 directly underneath the oxide layer 66. This is important because if all of the top surface barrier layer 4 is oxidized, electroplating the conductive material 68 into the cavities can not be carried out because no current would pass through the completely oxidized surface layers.

In another embodiment, a thin seed layer (not shown) may be formed over the barrier layer 4 in the structure of FIG. 6A. In this case, the seed layer on the top surface of the substrate would be dissolved during anodization and the barrier layer 4 would oxidize, thereby forming an oxide layer 66. Portions of the seed layer remain in the cavities over the barrier layer.

To fabricate the structure of FIG. 6C, the cavities as illustrated in FIG. 6A need to be electrically isolated during anodization. Otherwise, anodization would affect the entire substrate, including the cavities and the top surface. The isolation can be achieved through various means. For example, if the cavities are narrow and deep, the substrate can be lowered into the anodization electrolyte solution with the cavities facing downward. Gas/air trapped in the cavities can keep the electrolyte solution from reaching into the cavities and thus can act as an insulator.

Figure 7A:
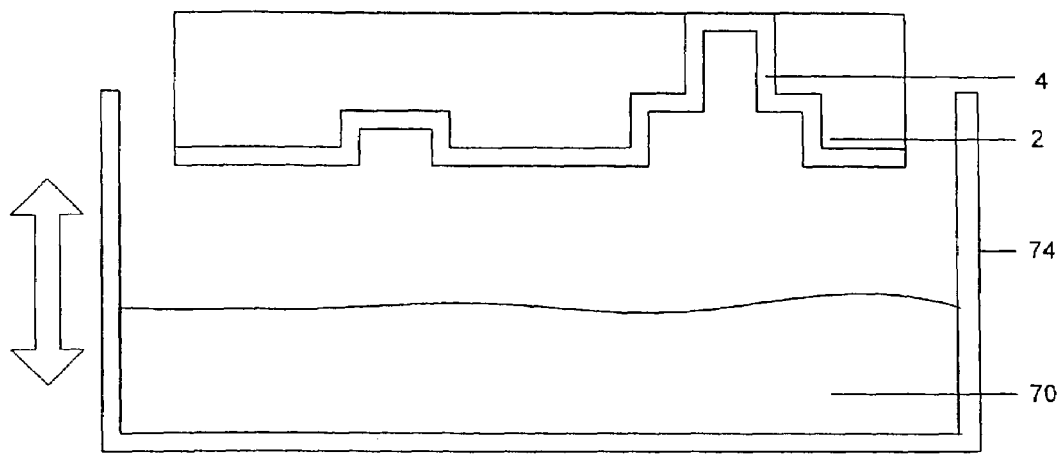
FIGS. 7A–7C illustrate cross sectional views of a method for forming an insulating material in cavities of a substrate in accordance with the preferred embodiment of the present invention.
Figure 7B:
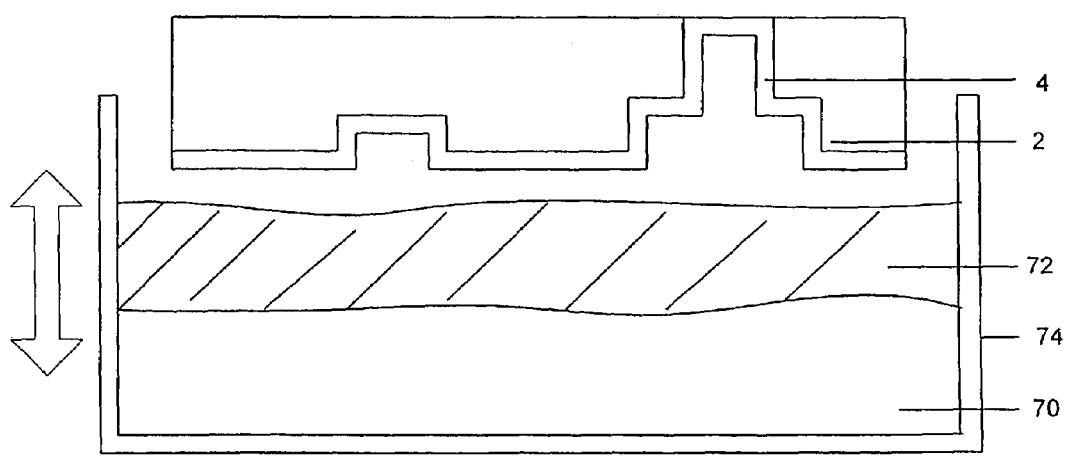
Figure 7C:
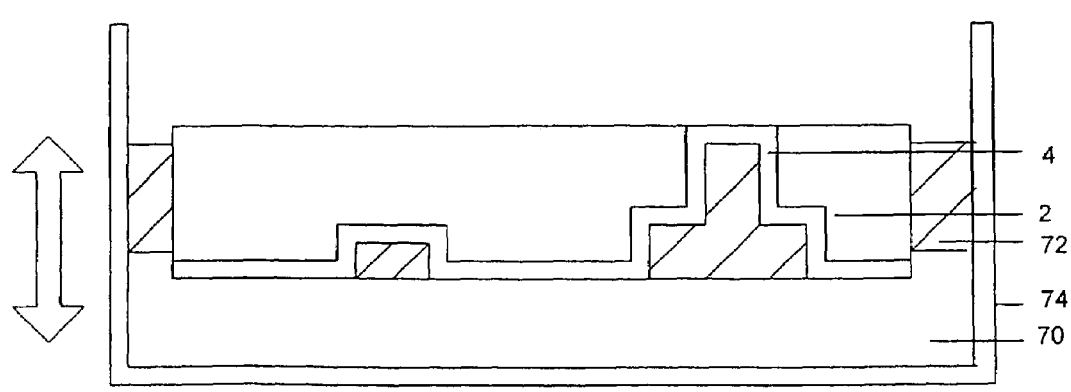

Alternately, an insulating material can be filled into the cavities before exposing the top surface of the substrate to the anodization electrolyte solution. For example, FIG. 7A illustrates a liquid chamber 74 having an electrolyte solution 70 contained therein. In FIG. 7B, an insulating solution 72, which is lighter in weight than the anodization electrolyte solution 70 and which does not mix with the electrolyte solution 70 is placed in the chamber 74 on top of the anodization electrolyte solution 70. In FIG. 7C, the chamber 74 is raised such that the top surface of the substrate (the side having the open end of the cavities) first makes contact with the insulating solution 72. Using this technique, the cavities are first filled with the insulating solution 72 as the liquid chamber 74 is raised. As the chamber 74 is further raised, the remaining top surface of the substrate (portions outside the cavities) is anodized as the top surface of the substrate makes contact with the electrolyte solution 70. Therefore, when anodization is performed on the top surface of the substrate, portions of the barrier layer 4 outside the cavities would form an oxide layer. The insulating solution 72 in the cavities prevents the oxide layer from forming in the cavities.

It should be noted that the approach described in FIGS. 7A–7C can also be employed to remove the seed layer from the top surface of a substrate. In this case, there would be a barrier layer and a seed layer on the original substrate. The anodization electrolyte solution 70 would be replaced with an etching electrolyte solution that would touch the seed layer on the top surface of the substrate and chemically etch the seed layer. However, the seed layer within the cavities would be protected by the insulating solution 72. Once the seed layer at the top surface is etched away, the substrate can be removed from the chamber. The insulating solution 72 can be removed from the cavities such that a conductive material can then be deposited in the cavities of the substrate.

Figure 8A:
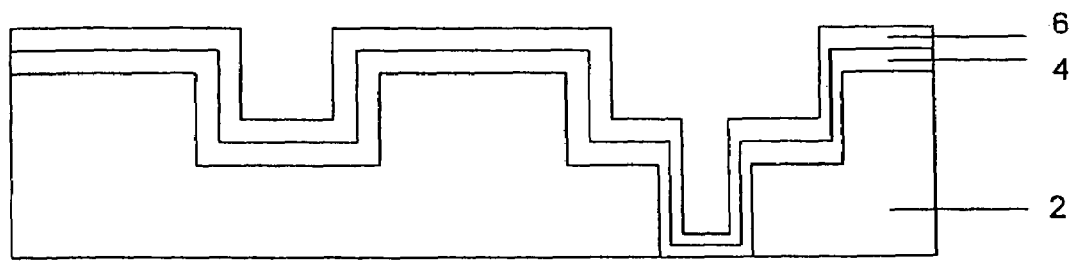
FIGS. 8A–8F illustrate cross sectional views of yet another method for depositing a conductive material in the cavities of a substrate in accordance with the preferred embodiment of the present invention.

FIGS. 8A–8F illustrate yet another embodiment of the present invention for depositing a conductive material in the cavities of a substrate. FIG. 8A illustrates a dielectric layer 2 deposited thereon a barrier layer 4 and a seed layer 6, similar to the structure as shown in FIG. 3A.

Figure 8B:
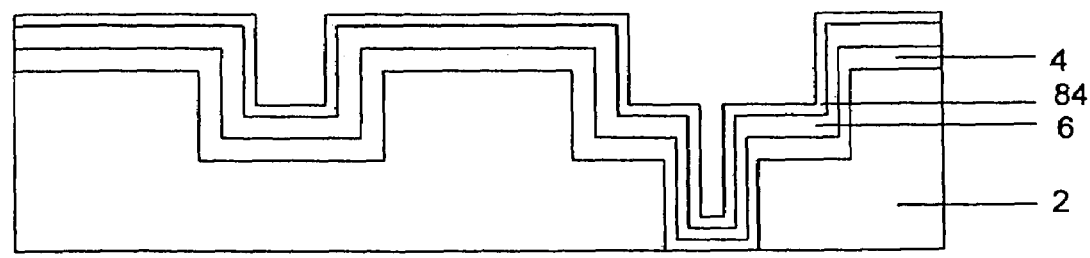
Figure 8C:
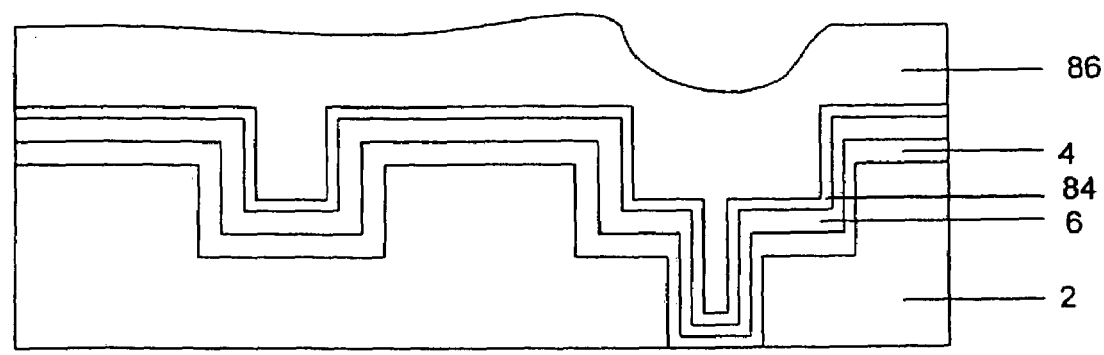

In FIG. 8B, a sacrificial or protective layer 84 of, for example chrome (Cr), is deposited on the seed layer 6 at a thickness of 25–1000 A$^\circ$. Thereafter, a hard glossy layer 86 made of SiO$_2$, cross linked epoxies, UV cured, etc. is coated over the Cr layer 84, resulting in the structure of FIG. 8C.

Figure 8D:
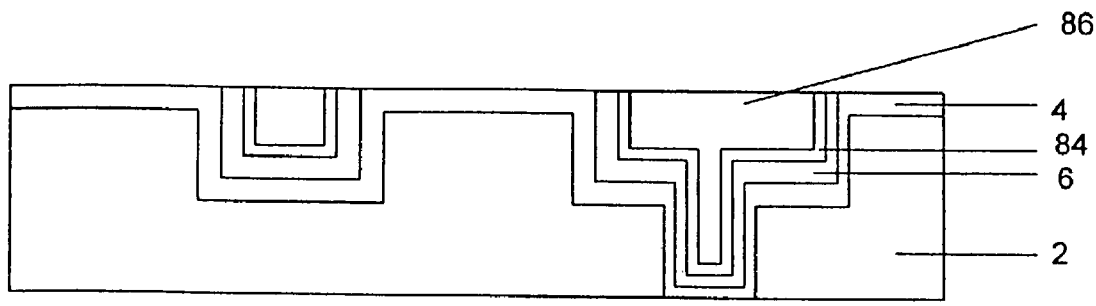
Figure 8E:
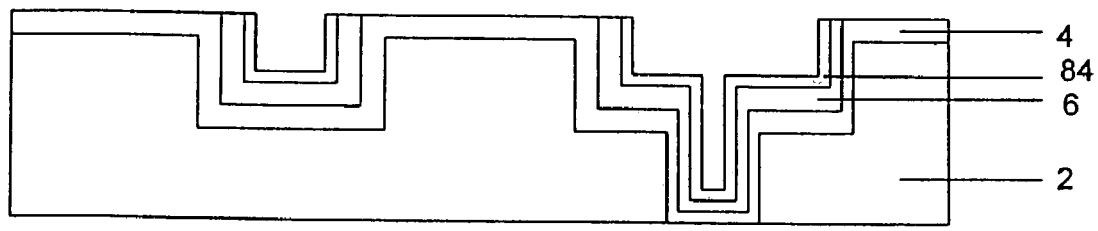
Figure 8F:
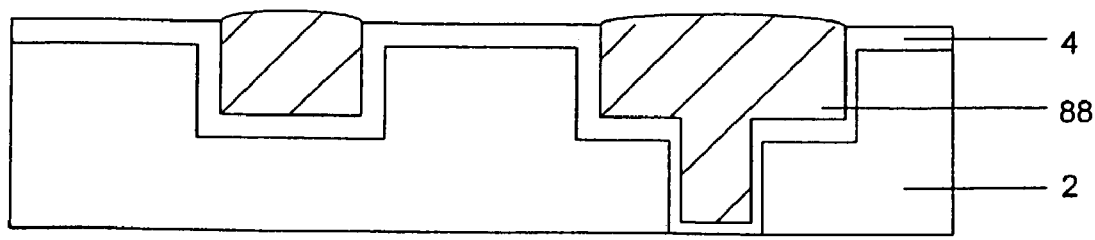

In FIG. 8D, the top surface of the substrate is then planarized using for example, an abrasive pad or solution, thereby removing the hard glossy layer 86, the Cr layer 84, and the seed layer 6 residing over the field regions. The hard glossy layer 86 in the cavities of the substrate is then removed using for example, a dilute HF, resulting in the structure of FIG. 8E. The remaining Cr layer within the cavities may be stripped away using an appropriate solvent as known in the art. Thereafter, a conductive material 88 may be deposited in the cavities of the substrate via electroplating, electroless, and the like.

Along with using copper and its alloys as the conductive material, other conductive materials such as aluminum, iron, nickel, chromium, indium, lead, tin, lead-tin alloys, non-leaded solderable alloys, silver, zinc, cadmium, titanium, tungsten molybdenum, ruthenium, gold, paladium, cobalt, rhondium, platinum, their respective alloys and various combinations of above material with oxygen, nitrogen, hydrogen and phosphorous may be used in the present invention.

In the previous descriptions, numerous specific details are set forth, such as specific materials, structures, chemicals, processes, etc., to provide a thorough understanding of the present invention. However, as one having ordinary skill in the art would recognize, the present invention can be practiced without resorting to the details specifically set forth.

Although various preferred embodiments have been described in detail above, those skilled in the art will readily appreciate that many modifications of the exemplary embodiment are possible without materially departing from the novel teachings and advantages of this invention.

The invention claimed is:

1. A method of electroplating a metal in a feature formed in a substrate, the substrate having a top surface, the feature having a bottom and sidewalls, the method comprising:

depositing a barrier layer on the top surface of the substrate and the bottom and sidewalls of the feature;

depositing a seed layer of the metal on the barrier layer;
removing the seed layer from the top surface of the substrate, thereby exposing the barrier layer on the top surface of the substrate and leaving the seed layer on the sidewalls and on the bottom of the feature;
during the removing, applying an electrical potential between the substrate and an electrode; and
electroplating the metal on the seed layer so that the metal fills the feature with substantially no electroplating on the top surface.

2. A method of electroplating a metal according to claim 1, wherein the removing comprises chemical mechanical polishing.

3. A method of electroplating a metal according to claim 2, wherein the metal comprises copper.

4. A method of electroplating a metal according to claim 3, wherein the barrier layer comprises tantalum and tantalum nitride.

5. A method of electroplating a metal according to claim 1, wherein the metal comprises copper.

6. A method of electroplating a metal according to claim 5, wherein the barrier layer comprises tantalum and tantalum nitride.

7. A method of electroplating a metal according to claim 1, wherein the barrier layer comprises tantalum and tantalum nitride.

8. A method of electroplating a metal according to claim 1, wherein the electroplating the metal fills the feature to an excess, the method further comprising removing the excess metal so that a top surface of the metal is substantially planar with the barrier layer on the top surface of the substrate.

9. A method of electroplating a metal according to claim 1, further comprising removing the barrier layer from the top surface of the substrate.

10. A method of electroplating a metal according to claim 1, wherein the electrode comprises an anode and the substrate comprises a cathode.

11. A method of electroplating a metal according to claim 1, wherein the electrode comprises a cathode and the substrate comprises an anode.

12. A method of electroplating a metal according to claim 1, wherein the electrode comprises a cathode and the seed layer on the top surface of the substrate comprises an anode.

13. A method of electroplating a metal according to claim 1, wherein removing the seed layer comprises polishing the seed layer on the top surface of the substrate with a pad.

14. A method of electroplating a metal according to claim 1, wherein electroplating the metal comprises polishing the top surface of the substrate with a pad.

15. A method of electroplating a metal according to claim 1, wherein the removing the seed layer and the electroplating the metal occur simultaneously.

16. A method of electroplating a metal on a substrate including a feature having a bottom and sidewalls, the substrate having a barrier layer and a seed layer deposited on a top surface of the substrate and on the bottom and the sidewalls of the feature, the method comprising:
removing the seed layer from the top surface of the substrate, thereby exposing the barrier layer on the top surface of the substrate and leaving the seed layer on the sidewalls and on the bottom of the feature;
during the removing, applying an electrical potential between the substrate and an electrode; and
electroplating the metal on the seed layer so that the metal fills the feature, with substantially no electroplating on the top surface.

17. A method of electroplating a metal according to claim 16, wherein the removing comprises chemical mechanical polishing.

18. A method of electroplating a metal according to claim 17, wherein the metal comprises copper.

19. A method of electroplating a metal according to claim 18, wherein the barrier layer comprises tantalum and tantalum nitride.

20. A method of electroplating a metal according to claim 16, wherein the metal comprises copper.

21. A method of electroplating a metal according to claim 20, wherein the barrier layer comprises tantalum and tantalum nitride.

22. A method of electroplating a metal according to claim 16, wherein the barrier layer comprises tantalum and tantalum nitride.

23. A method of electroplating a metal according to claim 16, wherein the electroplating the metal fills the feature to an excess, the method further comprising removing the excess metal so that a top surface of the metal is substantially planar with the barrier layer on the top surface of the substrate.

24. A method of electroplating a metal according to claim 16, further comprising removing the barrier layer from the top surface of the substrate.

25. A method of electroplating a metal according to claim 16, wherein the electrode comprises an anode and the substrate comprises a cathode.

26. A method of electroplating a metal according to claim 16, wherein the electrode comprises a cathode and the substrate comprises an anode.

27. A method of electroplating a metal according to claim 16, wherein the electrode comprises a cathode and the seed layer on the top surface of the substrate comprises an anode.

28. A method of electroplating a metal according to claim 16, wherein removing the seed layer comprises polishing the seed layer on the top surface of the substrate with a pad.

29. A method of electroplating a metal according to claim 16, wherein electroplating the metal comprises polishing the top surface of the substrate with a pad.

30. A method of electroplating a metal according to claim 16, wherein the removing the seed layer and the electroplating the metal occur simultaneously.

* * * * *